(12) United States Patent
Jang et al.

(10) Patent No.: US 6,329,717 B1
(45) Date of Patent: Dec. 11, 2001

(54) INTEGRATED CIRCUIT HAVING SELECTIVITY DEPOSITED SILICON OXIDE SPACER LAYER FORMED THEREIN

(75) Inventors: Syun-Ming Jang, Hsin-Chu; Chen-Hua Yu, Keelung; Lung Chen; Lin-June Wu, both of Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 1073 days.

(21) Appl. No.: 08/616,140

(22) Filed: Mar. 14, 1996

Related U.S. Application Data

(62) Division of application No. 08/518,706, filed on Aug. 24, 1995, now Pat. No. 5,518,959.

(51) Int. Cl.[7] .......................... H01L 23/48; H01L 29/46; H01L 29/54
(52) U.S. Cl. .......................... 257/750; 257/758; 257/765; 257/764; 257/759; 257/751; 257/741; 257/774
(58) Field of Search .................................. 257/750, 758, 257/765, 764, 759, 751, 741, 774

(56) References Cited

U.S. PATENT DOCUMENTS

| | | | |
|---|---|---|---|
| 4,566,026 | * 1/1986 | Lee et al. ........................... | 257/751 |
| 4,717,687 | 1/1988 | Verma ................................ | 437/97 |
| 4,872,947 | 10/1989 | Wang et al. ....................... | 156/643 |
| 4,931,410 | * 6/1990 | Tokunaga et al. ................. | 257/741 |
| 5,132,774 | * 7/1992 | Matsuura et al. ................. | 257/758 |
| 5,202,579 | * 4/1993 | Fujii et al. ........................ | 257/758 |
| 5,302,555 | 4/1994 | Yu ..................................... | 437/235 |
| 5,306,952 | * 4/1994 | Matsuura et al. ................. | 257/765 |
| 5,341,026 | * 8/1994 | Harada et al. ..................... | 257/750 |
| 5,354,715 | 10/1994 | Wang et al. ....................... | 437/238 |
| 5,387,812 | * 2/1995 | Forouhi et al. ................... | 257/758 |
| 5,399,387 | 3/1995 | Hieber et al. ..................... | 427/579 |
| 5,530,418 | * 6/1996 | Hsu et al. .......................... | 338/307 |
| 5,552,344 | * 9/1996 | Jang et al. ......................... | 437/195 |

OTHER PUBLICATIONS

E.J. Korczyski et al, "Improved Sub–Micron Inter–Metal Dielectric Gap–Filling TEOS/Ozone APCVD", Microelectronics Tech, Jan., 1992 pp. 22–27.

* cited by examiner

Primary Examiner—Alexander O. Williams
(74) Attorney, Agent, or Firm—George O. Saile; Stephen B. Ackerman; Alek P. Szecsy

(57) ABSTRACT

A method for selectively depositing a silicon oxide insulator spacer layer between multi-layer patterned metal stacks within an integrated circuit. Formed upon a semiconductor substrate is a silicon oxide insulator substrate layer which is formed through a Plasma Enhanced Chemical Vapor Deposition (PECVD) process. Upon the silicon oxide insulator substrate layer are formed multi-layer patterned metal stacks. The multi-layer patterned metal stacks have a top barrier metal layer formed from titanium nitride and a lower-lying conductor metal layer formed from an aluminum containing alloy. Formed selectively upon the portions of the silicon oxide insulator substrate layer exposed through the multi-layer patterned metal stacks and upon the edges of the aluminum containing alloy exposed through the multi-layer patterned metal stacks is a silicon oxide insulator spacer layer. The silicon oxide insulator spacer layer is formed through an ozone assisted Chemical Vapor Deposition (CVD) process employing Tetra Ethyl Ortho Silicate as the silicon source material. The silicon oxide insulator spacer layer is formed for a deposition time not exceeding an incubation time for forming the silicon oxide insulator spacer layer upon the top barrier metal layer formed from titanium nitride.

10 Claims, 4 Drawing Sheets

INTEGRATED CIRCUIT HAVING SELECTIVITY DEPOSITED SILICON OXIDE SPACER LAYER FORMED THEREIN

CROSS-REFERENCE TO RELATED APPLICATION

This application is a divisional application of Ser. No. 08/518,706, filed on Aug. 24, 1995 U.S. Pat. No. 5,518,959.

BACKGROUND OF THE INVENTION

1. Field of the Invention

The present invention relates generally to insulator layers formed within integrated circuits. More particularly, the present invention relates to silicon oxide insulator spacer layers selectively deposited within patterned metal conductor layers within integrated circuits.

2. Description of the Related Art

Integrated circuits are typically fabricated from semiconductor substrates upon whose surfaces are formed a multiplicity of active semiconductor regions. Within those active semiconductor regions are formed transistors, resistors, diodes and other electrical circuit elements. Those electrical circuit elements are interconnected internally and externally to the semiconductor substrates upon which they are formed through the use of conductor metal layers which are separated by insulator layers.

In accord with the continuing evolutionary trend in semiconductor technology, conductor metal line-widths and spacings within advanced semiconductor integrated circuits have continued to decrease while aspect ratios of those conductor metal lines have continued to increase. As a result of these factors, it is frequently desirable in advanced semiconductor integrated circuits to develop methods and materials through which there may be formed between adjoining patterned conductor metal layers insulator spacer layers which possess excellent gap filling and planarizing properties. Insulator spacer layers which possess excellent gap filling and planarizing properties are most likely to provide void free insulator spacer layers which provide superior substrates for over-lying insulator layers which may provide additional gap- filling and planarizing properties.

It is towards the goal of developing silicon oxide insulator spacer layers which possess excellent gap filling and planarizing properties that the present invention is directed.

Methods by which there may be formed upon semiconductor substrates various types of layers which have specific growth properties, such as gap filling and planarizing properties, are known in the art. For example, Verma in U.S. Pat. No. 4,717,687 describes a method for growing thermal oxides at different rates upon different portions of a semiconductor substrate. The method derives from different growth rates for thermal oxides grown from crystalline silicon semiconductor substrate regions in comparison with thermal oxides grown from metastable amorphous silicon semiconductor substrate regions.

In addition, Yu in U.S. Pat. No. 5,302,555 discloses a method for preferentially depositing a silicon oxide coating on horizontal surfaces of structured semiconductor substrates. The method involves control of several parameters related to the gaseous reactant mixture from which is deposited the silicon oxide coating and several additional parameters related to design of the reactor within which is deposited the silicon oxide coating. Significant parameters which are controlled include the flow ratio of reactant gases, the reactor pressure and the geometry of the susceptor within the reactor.

Still further, Wang et al., in U.S. Pat. Nos. 4,872,947 and 5,354,715, and E. J. Korczyski et al., in "Improved Sub-Micron Inter-Metal Dielectric Gap-Filling TEOS/Ozone APCVD," Microelectronics Tech., January 1992, pp. 22–27, describe process methods and process hardware for forming planarizing silicon oxide insulating layers through an ozone assisted Chemical Vapor Deposition (CVD) process employing Tetra Ethyl Ortho Silicate (TEOS) as the silicon source material.

Most pertinent to the present invention, however, is the disclosure of Hieber et al. in U.S. Pat. No. 5,399,389. Hieber discloses a method for locally and globally planarizing a structured semiconductor substrate with a silicon oxide layer formed through an ozone activated Chemical Vapor Deposition (CVD) process. The method employs a structured semiconductor substrate fabricated from materials at the lower levels of the structure which have inherently increased growth rates for silicon oxide layers formed through an ozone activated Chemical Vapor Deposition (CVD) process. The method preferably employs a Boro Phospho Silicate Glass (BPSG) or a Phospho Silicate Glass (PSG) lower layer. Optionally, the method also employs a Plasma Enhanced Chemical Vapor Deposited (PECVD) silicon oxide upper layer to retard growth upon metallization layers which otherwise typically form upper layers of the structured semiconductor substrate.

Desirable in the art are methods and materials which expand from the Hiebert disclosure and yield silicon oxide insulator spacer layers which provide a superior substrate for overlying silicon oxide insulator layers, such as over-lying gap filling and planarizing silicon oxide insulating layers, within advanced integrated circuits. Most desirable are silicon oxide insulator spacer layers which may be formed selectively between adjoining patterned metal layers within an advanced integrated circuit and not upon the top surfaces of those adjoining patterned metal layers. Such selectively deposited silicon oxide insulator spacer layers would avoid the need for substantial additional processing, such as etch-back processing and sputtering processing, to remove thick portions of silicon oxide insulator spacer layers formed upon surfaces of those adjoining patterned metal layers.

SUMMARY OF THE INVENTION

A first object of the present invention is to provide a silicon oxide insulator spacer layer selectively deposited between adjoining patterned metal layers within an integrated circuit, but not on the surfaces of those adjoining patterned metal layers.

A second object of the present invention is to provide a silicon oxide insulator spacer layer in accord with the first object of the present invention, which silicon oxide insulator spacer layer is readily manufacturable.

A third object of the present invention is to provide a silicon oxide insulator spacer layer in accord with the first object of the present invention and the second object of the present invention, which silicon oxide insulator spacer layer is economical.

In accord with the objects of the present invention, a silicon oxide insulator spacer layer for use within patterned metal layers within integrated circuits is described along with a method by which the silicon oxide insulator spacer layer is formed. To form the silicon oxide insulator spacer layer of the present invention, there is first formed upon a semiconductor substrate a silicon oxide insulator substrate layer, which silicon oxide insulator substrate layer is formed through a Plasma Enhanced Chemical Vapor Deposition (PECVD) process. Upon the silicon oxide insulator substrate layer is formed a patterned multi-metal stack. The patterned multi-metal stack is comprised of a top barrier metal layer formed from titanium nitride and a lower conductor metal layer formed from an aluminum containing alloy. Finally, there is formed selectively upon the portions of the silicon oxide insulator substrate layer exposed through the patterned multi-metal stack and upon the edges of the aluminum containing alloy conductor metal layer exposed through the patterned multi-metal stack a silicon oxide insulator spacer layer. The silicon oxide insulator spacer layer is formed through an ozone assisted Chemical Vapor Deposition (CVD) process for a deposition time not exceeding an incubation time for forming the silicon oxide insulator spacer layer upon the surface of the titanium nitride top barrier metal layer.

The silicon oxide insulator spacer layer of the present invention is formed selectively between adjoining patterned metal layers within an integrated circuit, but not on the surfaces of those adjoining metal layers. It has been found experimentally that the rate of formation of the silicon oxide insulator spacer layer through the ozone assisted Chemical Vapor Deposition (CVD) method of the present invention depends strongly upon the substrate upon which the silicon oxide insulator spacer layer is formed. Within the present invention the silicon oxide insulator spacer layer forms most rapidly upon silicon oxide insulator substrate layers which are formed through a Plasma Enhanced Chemical Vapor Deposition (PECVD) process. The silicon oxide insulator spacer layer forms somewhat less rapidly upon aluminum containing alloy conductor metal layers. Finally, the silicon oxide insulator spacer layer forms substantially less rapidly upon titanium nitride barrier metal layers.

In addition, the silicon oxide insulator spacer layers of the present invention exhibit a substantial incubation period before they are formed upon titanium nitride barrier metal layers. A substantial incubation period is not exhibited for the silicon oxide insulator spacer layer of the present invention formed upon the surfaces of silicon oxide insulator substrate layers or aluminum containing alloy conductor metal layers. As a result of this substantial incubation period, it is possible to form the silicon oxide insulator spacer layer of the present invention selectively upon the exposed surfaces of a Plasma Enhanced Chemical Vapor Deposited (PECVD) silicon oxide insulator substrate layer and the exposed edges of a patterned aluminum containing alloy conductor metal layer which resides beneath a patterned titanium nitride barrier metal layer while not forming the silicon oxide insulator spacer layer of the present invention upon the surfaces of that patterned titanium nitride barrier metal layer.

The silicon oxide insulator spacer layer of the present invention is readily manufacturable. The silicon oxide insulator spacer layer of the present invention, and the substrates upon which that silicon oxide insulator spacer layer is formed, are formed through methods and materials which are conventional to the art and typically employed in manufacture of silicon oxide insulator spacer layers which are not within the scope of the present invention. Since the fabrication of the silicon oxide insulator spacer layer of the present invention requires neither any new manufacturing equipment nor any new materials, the silicon oxide insulator spacer layer of the present invention is manufacturable. For analogous reasons, the silicon oxide insulator spacer layer of the present invention is also economical.

BRIEF DESCRIPTION OF THE DRAWINGS

The accompanying drawings, which form a material part of this disclosure, show the following.

DESCRIPTION OF THE PREFERRED EMBODIMENT

Figure 1:
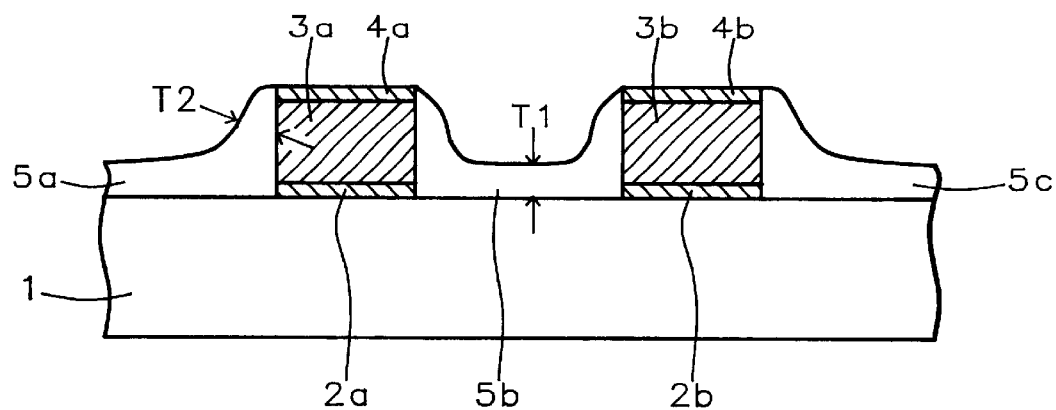
FIG. 1 shows a cross-sectional schematic diagram illustrating the critical features of the silicon oxide insulator spacer layer of the present invention.

The present invention provides an improved method for forming a gap filling and planarizing silicon oxide insulator spacer layer within patterned metal layers within an integrated circuit. The present invention provides a silicon oxide insulator spacer layer which is formed selectively upon the exposed surfaces of a silicon oxide insulator substrate layer and upon the exposed edges of a patterned aluminum containing conductor metal layer which reside beneath a patterned titanium nitride barrier metal layer within an integrated circuit. The silicon oxide insulator spacer layer of the present invention is not formed upon the surfaces of the patterned titanium nitride barrier metal layer which resides upon the surface of the patterned aluminum containing conductor metal layer. The silicon oxide insulator spacer layer of the present invention is formed selectively as long as the deposition time for the silicon oxide insulator spacer layer of the present invention is less than the incubation time at which the silicon oxide insulator spacer layer will form upon a titanium nitride barrier metal layer which resides upon a patterned aluminum containing conductor metal layer within an integrated circuit.

The selectively deposited silicon oxide insulator spacer layer of the present invention provides several advantages to integrated circuits within which that silicon oxide insulator spacer layer is selectively deposited. The silicon oxide insulator spacer layer of the present invention provides a superior substrate for over-lying silicon oxide insulating layers, such as additional gap-filling and planarizing silicon oxide insulating layers within the same integrated circuit as is deposited the silicon oxide insulator spacer layer of the present invention. In addition, the selectively deposited silicon oxide insulator spacer layer of the present invention provides a patterned metal layer which has formed between its patterns but not upon the surfaces of its patterns the silicon oxide insulator spacer layer of the present invention. Silicon oxide insulator spacer layers of the present invention, when formed upon the upper surfaces of patterned metal layers may be sufficiently absorptive of moisture to corrode those upper surfaces, thus yielding contact resistance problems with overlying metals formed upon those patterned metal layers.

The selectively deposited silicon oxide insulator spacer layer of the present invention may be formed within any integrated circuit wherein there is needed a gap filling and planarizing silicon oxide insulator spacer layer which is selectively deposited upon silicon oxide insulator substrate layers and adjoining aluminum containing alloy conductor metal layers. Typically, the selectively deposited silicon oxide insulator spacer layer of the present invention will be formed within the patterns of a patterned metal layer within an integrated circuit. The selectively deposited silicon oxide insulator spacer layer of the present invention may be used as a silicon oxide insulator spacer layer within a first patterned metal layer within an integrated circuit, within a second patterned metal layer within an integrated circuit or within any subsequent patterned metal layer(s) within an integrated circuit.

The selectively deposited silicon oxide insulator spacer layer of the present invention also has broad applicability as a silicon oxide insulator spacer layer within various types of integrated circuits. The selectively deposited silicon oxide insulator spacer layer of the present invention may be used in integrated circuits including but not limited to Dynamic Random Access Memory (DRAM) integrated circuits, Static Random Access Memory (SRAM) integrated circuits, Application Specific Integrated Circuits (ASICs), integrated circuits having field effect transistors formed within their structures and integrated circuits having bipolar transistors formed within their structures.

Referring now to FIG. 1 there is shown a cross-sectional schematic diagram illustrating the critical features of the silicon oxide insulator spacer layer of the present invention, and the substrate layers upon which that silicon oxide insulator spacer layer is formed. Shown in FIG. 1 is a planarized silicon oxide insulator substrate layer 1 upon which resides a pair of three-layer patterned metal stacks. Within the pair of three-layer patterned metal stacks, there resides at the bottoms a pair of patterned lower barrier metal layers 2a and 2b. Upon the patterned lower barrier metal layers 2a and 2b resides a pair of patterned conductor metal layers 3a and 3b, and upon the pair of patterned conductor metal layers 3a and 3b resides a pair of patterned upper barrier metal layers 4a and 4b. Between and adjoining the pair of three-layer patterned metal stacks is selectively formed the silicon oxide insulator spacer layer of the present invention, which is formed from silicon oxide insulator spacer layers 5a, 5b and 5c. With the exception of the pair of patterned lower barrier metal layers 2a and 2b, each of the component layers shown within FIG. 1 is critical to the present invention.

In part, the viability of the present invention derives from differences of in growth rates silicon oxide insulator spacer layers formed through ozone assisted Chemical Vapor Deposition (CVD) processes upon: (1) silicon oxide insulator substrate layers, (2) aluminum containing alloy conductor metal layers, and (3) titanium nitride barrier metal layers formed upon aluminum containing alloy conductor metal layers. In addition, the viability of the present invention also derives from the existence of a substantial incubation period for forming a silicon oxide insulator spacer layer through an ozone assisted Chemical Vapor Deposition (CVD) process upon the surface of a titanium nitride barrier metal layer. Such a substantial incubation period is not observed for forming the silicon oxide insulator spacer layer of the present invention upon silicon oxide insulator substrate layers or aluminum containing alloy conductor metal layers.

For the present invention, the planarized silicon oxide insulator substrate layer 1 is formed through planarizing a conformal silicon oxide insulator substrate layer which is formed through a Plasma Enhanced Chemical vapor Deposition (PECVD) process. Processes through which a conformal silicon oxide insulator substrate layer may be planarized are known in the art. Typically, such process involve Reactive Ion Etch (RIE) planarizing or Chemical-Mechanical Polish (CMP) planarizing. Although it is not essential to the present invention that the planarized silicon oxide insulator substrate layer 1 in fact be planarized, it is preferred due to the high aspect ratios and close spacings of patterned metal layers typical to advanced integrated circuits.

Plasma Enhanced Chemical Vapor Deposition (PECVD) processes are known in the art to form dense and impervious conformal silicon oxide insulator substrate layers. Several silicon source materials may be employed in forming the conformal silicon oxide insulator substrate layer from which is formed the planarized silicon oxide insulator substrate layer 1. Such silicon source materials include but are not limited to Tetra Ethyl Ortho Silicate (TEOS), silane, Octa Methyl Cyclo Tetra Siloxane (OMCTS) and Hexa Methyl Di-Silazane (HMDS). For economic and commercial reasons, the preferred materials from which the planarized silicon oxide insulator substrate layer 1 is formed are silane and Tetra Ethyl Ortho Silicate (TEOS).

The next critical elements to the present invention are the materials from which are formed the pair of patterned conductor metal layers 3a and 3b, and the pair of patterned upper barrier metal layers 4a and 4b. It is critical to the present invention that the patterned conductor metal layers 3a and 3b are formed from an aluminum containing alloy. Preferably the patterned conductor metal layers 3a and 3b are formed of an aluminum containing alloy containing about 0.5 to about 1.0 percent copper. Preferably, the patterned conductor metal layers 3a and 3b are formed at about 4000 to about 6000 angstroms thickness.

It is also critical to the present invention that the pair of patterned upper barrier metal layers 4a and 4b are formed of titanium nitride, preferably at a thickness of about 1000 to about 1400 angstroms thickness. Although not critical to the present invention, the pair of patterned lower barrier metal layers are also preferably formed from titanium nitride, preferably at a thickness of about 800 to about 1200 angstroms. Overall, the total thickness of the three-layer patterned metal stacks within which is selectively formed the silicon oxide insulator spacer layer of the present invention are about 5800 to about 8600 angstroms each.

Methods through which the patterned lower barrier metal layers 2a and 2b, the patterned conductor metal layers 3a and 3b and the patterned upper barrier metal layers 4a and 4b may be formed upon the planarized silicon oxide insulator substrate layer 1 are conventional to the art. Such methods include but are not limited to thermal evaporation methods, electron beam assisted evaporation methods, Chemical Vapor Deposition (CVD) methods and Physical Vapor Deposition (PVD) sputtering methods. Although these methods are in general applicable for forming all of the patterned metal layers within the pair of three-layer patterned metal stacks, it is preferred that the titanium nitride patterned lower barrier metal layers 2a and 2b and the titanium nitride patterned upper barrier metal layers 4a and 4b be formed through a Physical Vapor Deposition (PVD) sputtering method.

Upon forming the three-layer patterned metal stacks of the present invention, there may be formed the selectively deposited silicon oxide insulator spacer layer of the present invention, which is formed from silicon oxide insulator spacer layers 5a, 5b and 5c. The silicon oxide insulator spacer layers 5a, 5b and 5c are formed through an ozone assisted Chemical Vapor Deposition (CVD) process employing Tetra Ethyl Ortho Silicate (TEOS) as the silicon source material. The silicon oxide insulator spacer layer of the present invention is formed at a comparatively high ozone concentration. Preferably, the ozone:TEOS molar ratio is from about 12:1 to about 20:1. The remaining process conditions under which the selectively deposited silicon oxide insulator spacer layer of the present invention is formed are a reactor pressure of about 350 to about 550 Torr, a Tetra Ethyl Ortho Silicate (TEOS) flow rate of about 27 to about 42 standard cubic centimeters per minute (sccm), a background helium flow rate of about 1850 to about 2750 standard cubic centimeters per minute (sccm), a deposition temperature of about 325 to about 475 degrees centigrade and an oxygen (ozone carrier gas) flow rate of about 4000 to about 6000 standard cubic centimeters per minute (sccm). Under these conditions, the selectively deposited silicon oxide insulator spacer layer of the present invention may be formed.

Under the conditions listed above, the selectively deposited silicon oxide insulator spacer layer of the present invention will exhibit an incubation time of about 50 to about 55 seconds prior to the time at which the silicon oxide insulator spacer layer will begin to form upon the surfaces of the titanium nitride patterned upper barrier metal layers 4a and 4b. At about 50 to about 55 seconds, the silicon oxide insulator spacer layer of the present invention will have grown to a thickness T1 over the planarized silicon oxide insulator substrate layer of about 1300 to about 1500 angstroms, and a thickness T2 adjoining the patterned aluminum containing conductor metal layer of about 1200 to about 1300 angstroms.

Having described the critical elements in forming the silicon oxide insulator spacer layer of the present invention, there will now be described the method through which the silicon oxide insulator spacer layer of the present invention is incorporated into an integrated circuit which represents the preferred embodiment into which the present invention is formed. Shown in FIG. 2a to FIG. 2e are a series of schematic cross-sectional diagrams which illustrate progressive stages forming the integrated circuit which represents the preferred embodiment into which the present invention is formed.

Figure 2A:
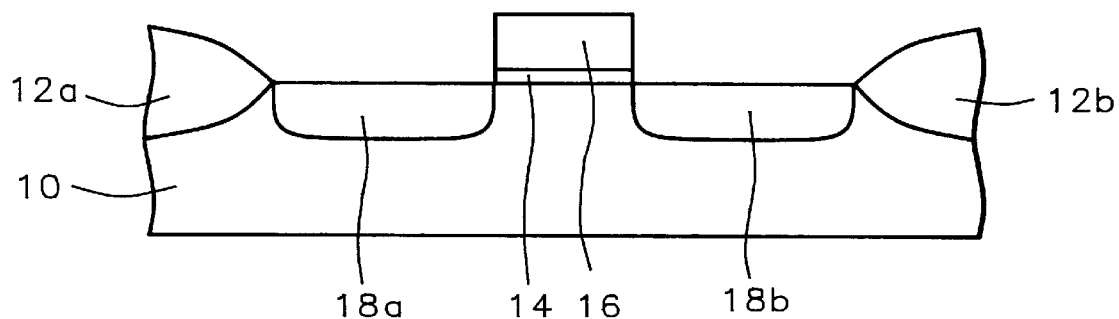
FIG. 2a to FIG. 2e illustrate an integrated circuit at progressive stages of fabrication, into which integrated circuit are formed silicon oxide insulator spacer layers of the present invention.

Shown in FIG. 2a is a cross-sectional schematic diagram of the integrated circuit at early stages of fabrication. FIG. 2a shows a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention will be a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate. For the preferred embodiment into which the present invention is formed, the isolation regions 12a and 12b are preferably formed through a thermal oxidation process whereby portions of the semiconductor substrate 10 exposed through an oxidation mask are consumed to form within and upon the semiconductor substrate 10 isolation regions 12a and 12b of silicon oxide.

Also illustrated within FIG. 2a is a gate oxide 14 upon which resides a gate electrode 16. Both the gate oxide 14 and the gate electrode 16 reside upon the active semiconductor region of the semiconductor substrate 10. Both the gate oxide 14 and the gate electrode 16 are components of a field effect transistor.

Methods and materials through which gate oxides and gate electrodes may be formed upon active semiconductor regions of semiconductor substrates are known in the art. Gate oxides may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal suicide stacks).

For the preferred embodiment into which the present invention is formed, the gate oxide 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 80 to about 140 angstroms. For the preferred embodiment into which the present invention is formed, the gate electrode 16 is preferably formed by patterning and etching a blanket layer of highly doped polysilicon formed upon the blanket gate oxide layer at a thickness of about 2500 to about 3000 angstroms through a Chemical Vapor Deposition (CVD) process employing silane as the silicon source material along with suitable dopant species. Once the blanket layer of highly doped polysilicon has been patterned to yield the gate electrode 16, the gate electrode may be used as an etch mask to pattern the gate oxide 14 from the blanket gate oxide layer.

Finally, there is shown in FIG. 2a source/drain electrodes 18a and 18b formed within the surface of the active semiconductor region of the semiconductor substrate 10 at areas not occupied by the gate electrode 16, the gate oxide 14 and the isolation regions 12a and 12b. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Arsenic dopant species, boron dopant species and phosphorus dopant species are common in the art. For the preferred embodiment into which the present invention is formed, the source/drain electrodes 18a and 18b are preferably formed through implanting a suitable dopant species into the active region of the semiconductor substrate 10 at about 4E13 to about 7E13 ions per square centimeter dose and about 100 to about 130 keV ion implantation energy.

Having formed a field effect transistor structure comprising source/drain electrodes 18a and 18b formed into the semiconductor substrate 10, and a gate electrode 16 upon a gate oxide 14 adjoining the source/drain electrodes 18a and 18b, the critical process steps in forming the silicon oxide insulator spacer layer of the present invention may proceed.

Figure 2B:
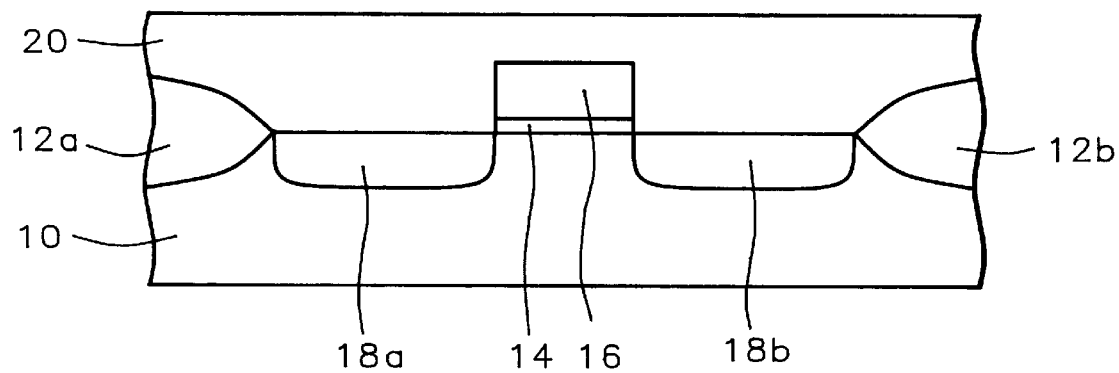
Figure 2C:
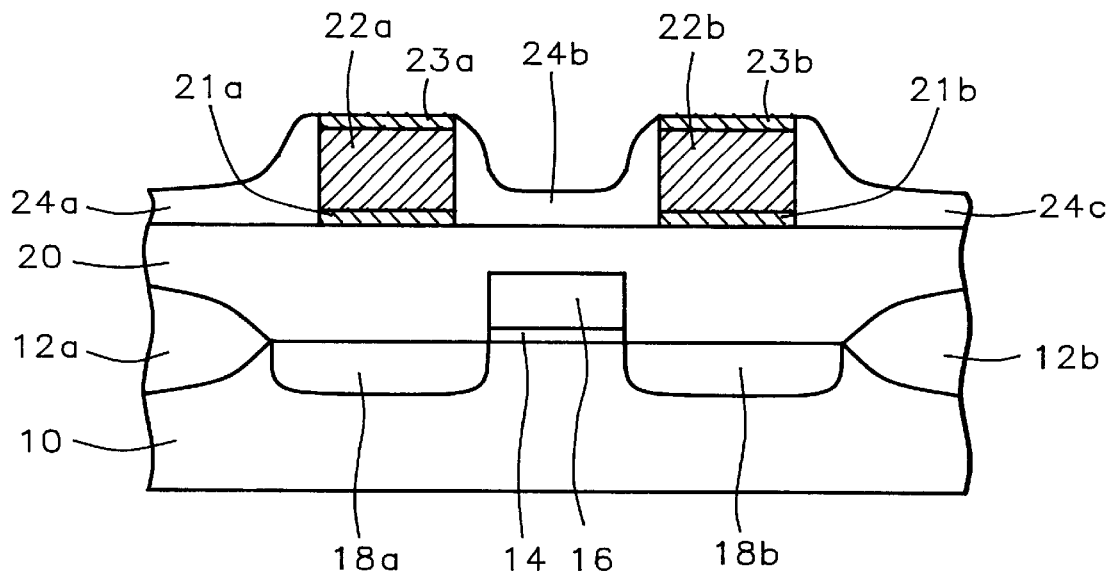

The results of these critical process steps are illustrated in FIG. 2b and FIG. 2c.

Shown in FIG. 2b is the presence of a planarized first silicon oxide insulator substrate layer 20 formed upon the semiconductor substrate 10 illustrated in FIG. 2a. The planarized first silicon oxide insulator substrate layer 20 of FIG. 2a corresponds with the planarized silicon oxide insulator substrate layer 1 illustrated in FIG. 1. The planarized first silicon oxide insulator substrate layer 20 is critical to the present invention. The planarized first silicon oxide insulator substrate layer 20 is formed through a Plasma Enhanced Chemical Vapor Deposition (PECVD) process preferably employing either Tetra Ethyl Ortho Silicate (TEOS) or silane as the silicon source material. The planarized first silicon oxide insulator substrate layer 20 is of a sufficient thickness to adequately cover the features residing upon the semiconductor substrate 10 upon which is formed the planarized first silicon oxide insulator substrate layer 20.

Illustrated in FIG. 2c is the next series of process steps by which there is formed into the integrated circuit of the preferred embodiment the silicon oxide insulator spacer layer of the present invention. Shown in FIG. 2c is the presence of a pair of three-layer patterned first metal stacks comprising patterned first lower barrier metal layers 21a and 21b, patterned first conductor metal layers 22a and 22b, and patterned first upper barrier metal layers 23a and 23b. The three-layer patterned first metal stacks correspond with the equivalent three-layer patterned metal stacks illustrated in FIG. 1. The patterned first lower barrier metal layers 21a and 21b are preferably formed of titanium nitride at a thickness of about 800 to about 1200 angstroms. The patterned first conductor metal layers 22a and 22b are critical to the present invention. They must be formed of an aluminum containing alloy, preferably containing about 0.5 to about 1.0 percent copper, and preferably at a thickness of about 4000 to about 6000 angstroms. Finally, the patterned first upper barrier metal layers 23a and 23b are also critical to the present invention. They must be formed of titanium nitride, preferably at a thickness of about 1000 to about 1400 angstroms, and preferably through a Physical Vapor Deposition (PVD) sputtering method.

Finally, there is shown in FIG. 2c the selectively deposited first silicon oxide insulator spacer layer formed from first silicon oxide insulator spacer layers 24a, 24b and 24c. The methods and materials through which are formed the first silicon oxide insulator spacer layers 24a, 24b and 24c follow analogously from the methods and materials through which are formed the silicon oxide insulator spacer layers 5a, 5b and 5c in FIG. 1. The first silicon oxide insulator spacer layers 24a, 24b and 24c are formed through an ozone assisted Chemical Vapor Deposition (CVD) process employing Tetra Ethyl Ortho Silicate (TEOS) as the silicon source material. Preferably, the ozone:TEOS molar ratio is from about 12:1 to about 20:1. Additional process parameters under which there are formed the first silicon oxide insulator spacer layers 24a, 24b and 24c include a reactor pressure of about 350 to about 550 Torr, a Tetra Ethyl Ortho Silicate (TEOS) flow rate of about 27 to about 42 standard cubic centimeters per minute (sccm), a background helium flow rate of about 1850 to about 2750 standard cubic centimeters per minute (sccm), a deposition temperature of about 325 to about 475 degrees centigrade and an oxygen (ozone carrier gas) flow rate of about 4000 to about 6000 standard cubic centimeters per minute (sccm).

As illustrated in FIG. 2c, the selectively deposited silicon oxide insulator spacer layer of the present invention is not formed upon the surfaces of the titanium nitride patterned first upper barrier metal layers 23a and 23b, provided that the first silicon oxide insulator spacer layers 24a, 24b and 24c of the preferred embodiment are not deposited for a time longer than about 50 to about 55 seconds. Within that time scale, the first silicon oxide insulator spacer layer of the present invention will have grown to a maximum thickness of about 1300 to about 1500 angstroms over the planarized first silicon oxide insulator substrate layer 20 and a maximum thickness of about 1200 to about 1300 angstroms adjoining the patterned first conductor metal layers 22a and 22b.

Figure 2D:
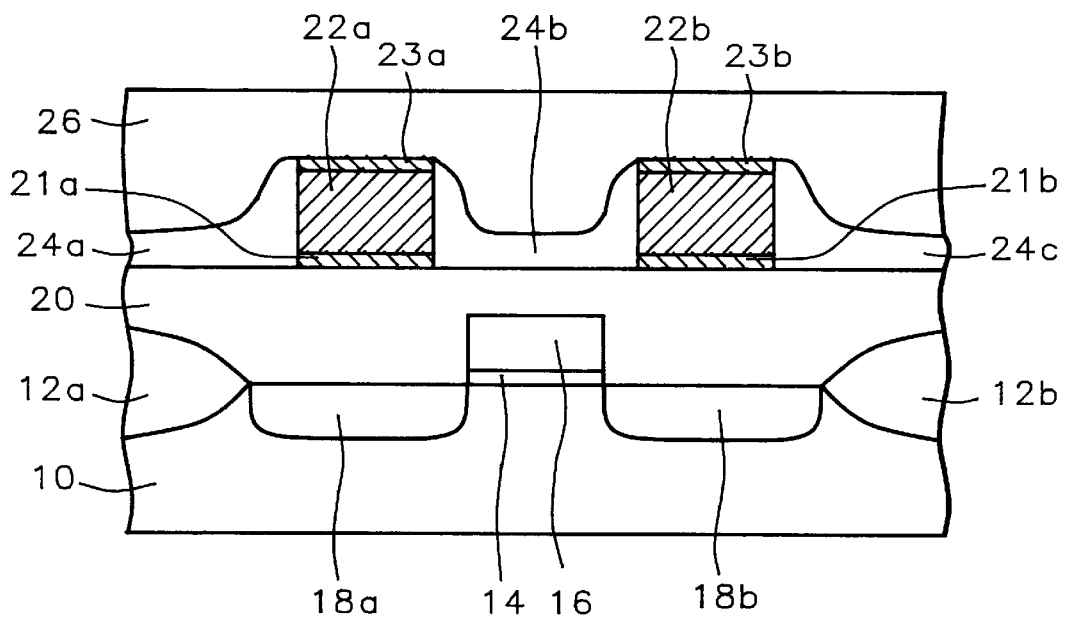

Referring now to FIG. 2d, there is shown the next process step in forming the preferred embodiment into which the present invention is formed. Shown in FIG. 2d is the presence of a planarized second silicon oxide insulator substrate layer 26. The planarized second silicon oxide insulator substrate layer 26 is formed through the same methods and materials as is formed the planarized first silicon oxide insulator substrate layer 20. In order to assure adequate planarity of the planarized second silicon oxide insulator substrate layer 26, it is important that the layer from which is formed the planarized second silicon oxide insulator substrate layer 26 be formed of a sufficient thickness to adequately cover all of the integrated circuit features which reside upon the semiconductor substrate 10. Planarization of the silicon oxide insulator layer from which is formed the planarized second silicon oxide insulator substrate layer 26 may be accomplished through etching and polishing methods as are conventional in the art.

As is understood by a person skilled in the art, additional planarized silicon oxide insulator substrate layers, additional multi-layer patterned metal stacks and additional silicon oxide insulator spacer layers may be formed upon the semiconductor substrate 10 surface illustrated in FIG. 2d to yield additional layers of the integrated circuit which comprises the preferred embodiment into which the present invention is formed. Such additional layers and stacks are illustrated in FIG. 2e.

Figure 2E:
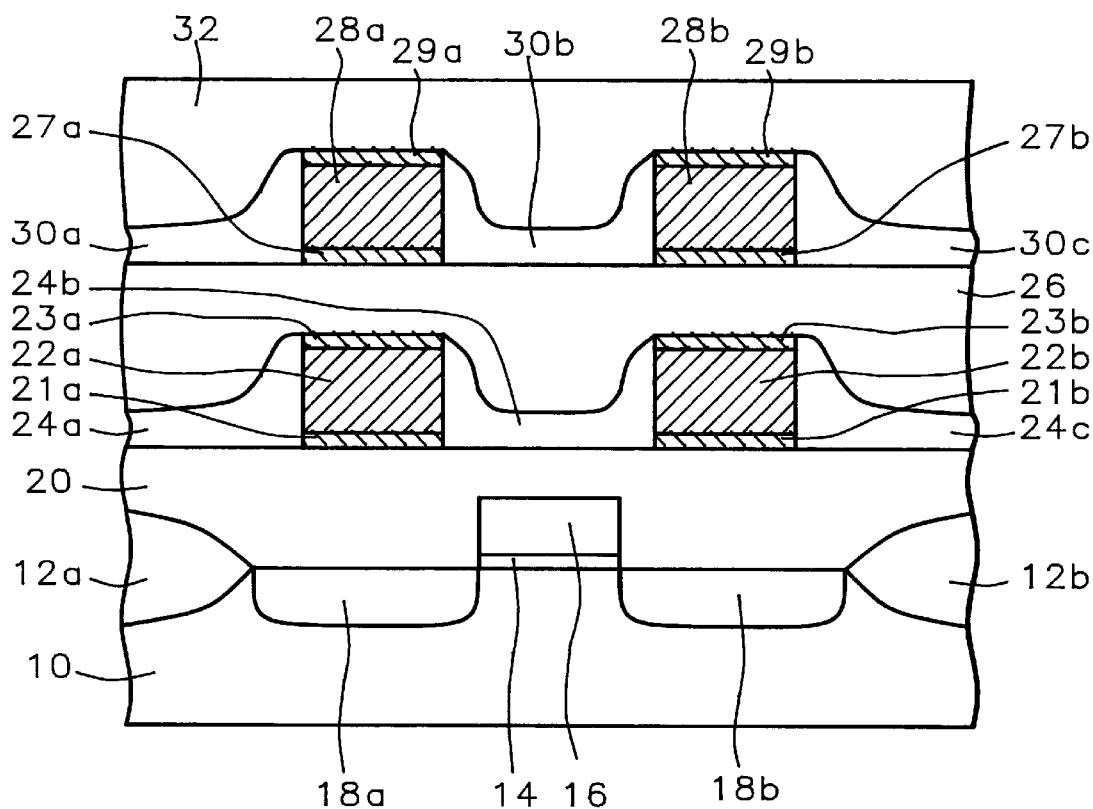

Illustrated in FIG. 2e is a pair of patterned second lower barrier metal layers 27a and 27b; a pair of patterned second conductor metal layers 28a and 28b; a pair of patterned second upper barrier metal layers 29a and 29b; second silicon oxide insulator spacer layers 30a, 30b and 30c; and a planarized third silicon oxide insulator substrate layer 32. The pair of patterned second lower barrier metal layers 27a and 27b may be formed through methods and materials equivalent to those employed in forming the pair of patterned first lower barrier metal layers 2a and 21b. The pair of patterned second conductor metal layers 28a and 28b may be formed through methods and materials equivalent to those employed in forming the pair of patterned first conductor metal layers 22a and 22b. The pair of patterned second upper barrier metal layers 29a and 29b may be formed through methods and materials equivalent to those employed in forming the patterned first upper barrier metal layers 23a and 23b. The second silicon oxide insulator spacer layers 30a, 30b and 30c may be formed through methods and materials equivalent to those employed in forming the first silicon oxide insulator spacer layers 24a, 24b and 24c. Finally, the planarized third silicon oxide insulator substrate layer 32 may be formed through methods and materials equivalent to those employed in forming the planarized second silicon oxide insulator substrate layer 26.

Upon forming the planarized third silicon oxide insulator substrate layer 32 there is formed the preferred embodiment of the present invention, which comprises an integrated circuit into which there is formed a multiplicity of silicon oxide insulator spacer layers of the present invention.

As is understood by a person skilled in the art, the preferred embodiment into which the present invention is formed is illustrative of the present invention rather than limiting of the present invention. Revisions to methods and materials through which is formed the preferred embodiment may yield additional embodiments which are within the spirit and scope of the present invention.

EXAMPLES

Upon the surfaces of three (100) silicon semiconductor substrate wafers were formed planarized silicon oxide insulator substrate layers and three-layer patterned metal stacks in accord with the schematic diagram illustrated in FIG. 1 and the accompanying description.

The planarized silicon oxide insulator substrate layers were formed through a Plasma Enhanced Chemical Vapor Deposition (PECVD) process employing Tetra Ethyl Ortho Silicate (TEOS) as the silicon source material. The process parameters included a Tetra Ethyl Ortho Silicate flow rate of about 800 standard cubic centimeters per minute (sccm), an oxygen flow rate of about 600 standard cubic centimeters per minute (sccm), a helium flow rate of about 800 standard cubic centimeters per minute (sccm) and a radio frequency power of about 675 watts.

Upon the planarized silicon oxide insulator substrate layers were formed titanium nitride patterned lower barrier metal layers through a Physical Vapor Deposition (PVD) sputtering process employing a titanium nitride target. The titanium nitride patterned lower barrier metal layers were about 1000 angstroms thick each.

Upon the titanium nitride patterned lower barrier metal layers were formed aluminum containing alloy patterned conductor metal layers through a Physical Vapor Deposition (PVD) sputtering process. The aluminum containing alloy patterned conductor metal layers were formed at a thickness of about 4000 angstroms from an aluminum alloy containing about 1 percent copper.

Upon the aluminum containing alloy patterned conductor metal layers were formed titanium nitride patterned upper barrier metal layers through a Physical Vapor Deposition (PVD) sputtering process employing a titanium nitride target. The titanium nitride patterned upper barrier metal layers were about 1200 angstroms thick each.

Upon each of the three semiconductor wafers having the equivalent planarized silicon oxide insulator substrate layers and the equivalent three-layer patterned metal stacks was then formed a silicon oxide insulator spacer layer in accord with the parameters preferred for the present invention. The silicon oxide insulator spacer layers were formed through an ozone assisted Chemical Vapor Deposition (CVD) process employing Tetra Ethyl Ortho Silicate (TEOS) as the silicon source material and an ozone:TEOS molar ratio of about 12 to about 20. Additional parameters under which those silicon oxide insulator spacer layers were formed included a reactor chamber pressure of about 450 Torr, a Tetra Ethyl Ortho Silicate (TEOS) flow of about 35 standard cubic centimeters per minute (sccm), a background helium flow rate of about 2300 standard cubic centimeters per minute (sccm), a temperature of about 400 degrees centigrade and an oxygen flow rate (ozone carrier gas) of about 5000 standard cubic centimeters per minute (sccm). Each of the three individual silicon oxide insulator spacer layers were formed upon the three equivalent semiconductor substrate wafers for a different time interval. The time intervals were 50 seconds, 150 seconds and 300 seconds.

After the three silicon oxide insulator spacer layers were formed upon the three equivalent semiconductor substrates at the three different time intervals, there was measured: (1) the thicknesses of the silicon oxide insulator spacer layers over the planarized silicon oxide insulator substrate layers (corresponding to T1 in FIG. 1); (2) the thicknesses of the three silicon oxide insulator spacer layers adjoining the exposed edges of the aluminum containing alloy patterned conductor metal layers (corresponding to T2 in FIG. 1); and, (3) the thicknesses of the three silicon oxide insulator spacer layers over the titanium nitride patterned upper barrier metal layers. For the semiconductor substrate upon which the silicon oxide insulator spacer layer was formed for 50 seconds, there was no silicon oxide insulator spacer layer formed upon the titanium nitride patterned upper barrier metal layers.

Figure 3:
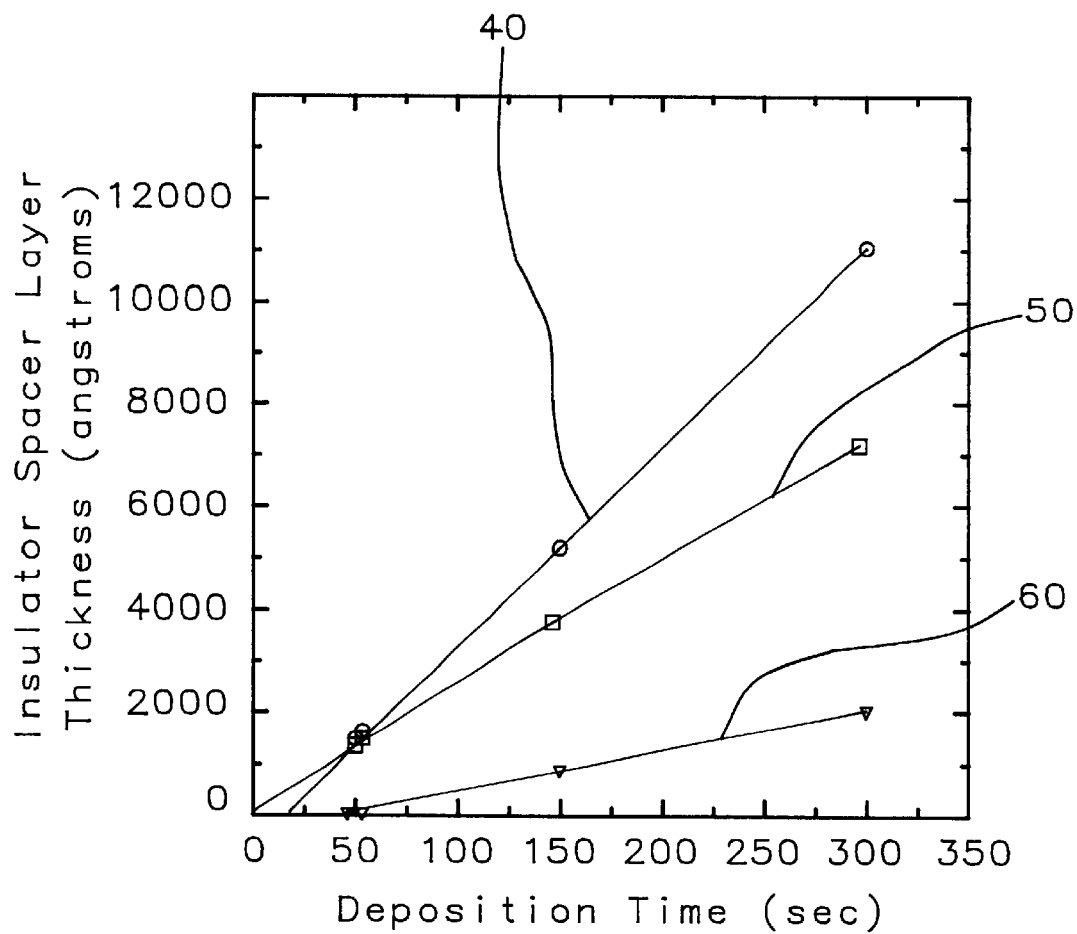
FIG. 3 shows a graph of Insulator Spacer Layer Thickness vs. Deposition Time for forming the silicon oxide insulator spacer layers of the present invention upon the substrate layers of the present invention.

The measured thicknesses described above were plotted to yield the graph of FIG. 3. Within FIG. 3, line 40 corresponds to the thicknesses of the three silicon oxide insulator spacer layers formed over the planarized silicon oxide insulator substrate layers (corresponding to T1 in FIG. 1). Line 50 corresponds to the thicknesses of the three silicon oxide insulator spacer layers adjoining the exposed edges of the aluminum containing alloy patterned conductor metal layers (corresponding to T2 in FIG. 1). Finally, line 60 corresponds to the thicknesses of the three silicon oxide insulator spacer layers over the titanium nitride patterned upper barrier metal layers. From lines 40, 50 and 60 were calculated: (1) the slopes which correspond to the deposition rates of the silicon oxide insulator spacer layers upon the individual substrate materials; and, (2) the x-axis intercepts which correspond to the incubation times for forming the silicon oxide insulator spacer layers upon those individual substrate materials. The deposition rates and incubation times are reported in TABLE I.

TABLE I

| O3-TEOS SPACER LAYER FORMATION RATES AND INCUBATION TIMES | | |
|---|---|---|
| Substrate Layer | Deposition Rate | Incubation Time |
| Titanium Nitride | 513 angstroms/min. | 52.7 seconds |
| Aluminum 1% Copper | 1442 | 0.0 |
| PECVD-TEOS | 2280 | 15.6 |

From review of the data in TABLE I it is seen that the deposition rate of the ozone assisted Chemical Vapor Deposited (CVD) silicon oxide insulator spacer layer upon the titanium nitride barrier metal layers is exceedingly low in comparison with the corresponding deposition rates for the silicon oxide insulator spacer layer upon either the aluminum containing alloy conductor metal layer substrate or the Plasma Enhanced Chemical Vapor Deposited (PECVD) planarized silicon oxide insulator substrate layer. Given this ordering of deposition rates, and the presence of a substantial incubation time for forming the silicon oxide insulator spacer layers upon titanium nitride barrier metal layers, the silicon oxide insulator spacer layers of the present invention may be readily formed between but not upon patterned metal layers within advanced integrated circuits.

What is claimed is:

1. An integrated circuit containing a selectively deposited silicon oxide insulator spacer layer between a pair of multilayer patterned metal stacks comprising:

a semiconductor substrate having a silicon oxide insulator substrate layer formed thereon, the silicon oxide insulator substrate layer being formed through a Plasma Enhanced Chemical Vapor Deposition (PECVD) process;

a pair of multi-layer patterned metal stacks formed upon the silicon oxide insulator substrate layer, the pair of multi-layer patterned metal stacks comprising a pair of top barrier metal layers formed from titanium nitride and a pair of lower-lying conductor metal layers formed from an aluminum containing alloy; and a silicon oxide insulator spacer layer formed selectively upon the portions of the silicon oxide insulator substrate layer exposed through the pair of multi-layer patterned metal stacks and upon the edges of the pair of lower-lying conductor metal layers exposed through the pair of multi-layer patterned metal stacks, the silicon oxide insulator spacer layer being formed through an ozone assisted Chemical Vapor Deposition (CVD) process, the silicon oxide insulator spacer layer being formed for a deposition time not exceeding an incubation time for forming the silicon oxide insulator spacer layer upon the pair of top barrier metal layers formed from titanium nitride.

2. The integrated circuit of claim 1 wherein the silicon oxide insulator substrate layer is formed through a Plasma Enhanced Chemical Vapor Deposition process which employs a silicon source material chosen from the group of silicon source materials consisting of silane and Tetra Ethyl Ortho Silicate (TEOS).

3. The integrated circuit of claim 1 wherein each of the top barrier metal layers within the pair of top barrier metal layers is about 1000 to about 1400 angstroms thick.

4. The integrated circuit of claim 1 wherein each of the top barrier metal layers within the pair of top barrier metal layers is formed through a Physical Vapor Deposition (PVD) sputtering method.

5. The integrated circuit of claim 1 wherein each of the lower-lying conductor metal layers within the pair of lower-lying conductor metal layers is about 4000 to about 6000 angstroms thick.

6. The integrated circuit of claim 1 wherein each of the lower-lying conductor metal layers within the pair of lower-lying conductor metal layers contains about 0.5 to about 1.0% copper.

7. The integrated circuit of claim 1 wherein ozone assisted Chemical Vapor Deposition (CVD) process employs Tetra Ethyl Ortho Silicate (TEOS) as the silicon source material.

8. The integrated circuit of claim 7 wherein the Tetra Ethyl Ortho Silicate is employed within the ozone assisted Chemical Vapor Deposition (CVD) process at an ozone-:TEOS ratio of about 12:1 to about 20:1.

9. The integrated circuit of claim 1 wherein the deposition time is equal to the incubation time, and the incubation time is from about 50 to about 55 seconds.

10. The integrated circuit of claim 9 wherein the thickness of the silicon oxide insulator spacer layer is about 1300 to about 1500 angstroms over the surface of the silicon oxide insulator substrate layer and the thickness of the silicon oxide insulator spacer layer is about 1200 to about 1300 angstroms adjoining the edges of the lower-lying conductor metal layer.

* * * * *